United States Patent
Ohie et al.

[11] Patent Number: 5,410,269
[45] Date of Patent: Apr. 25, 1995

[54] SAMPLE-AND-HOLD CIRCUIT

[75] Inventors: Mitsuya Ohie, Tokyo; Hisashi Nakamura, Osaka, both of Japan

[73] Assignee: Oki Electric Industry Co., Ltd., Tokyo, Japan

[21] Appl. No.: 62,753

[22] Filed: May 18, 1993

[30] Foreign Application Priority Data

May 27, 1992 [JP] Japan ................... 4-134798

[51] Int. Cl.⁶ ................. G11C 27/02; H03K 17/687
[52] U.S. Cl. ........................ 327/91; 327/95; 327/391
[58] Field of Search ............ 307/352, 353, 359, 362, 307/363, 585, 578

[56] References Cited

U.S. PATENT DOCUMENTS

| 4,523,107 | 6/1985 | Peterson | 307/352 |
| 4,656,429 | 4/1987 | Masuda et al. | 307/352 |
| 4,691,125 | 9/1987 | Rybicki | 307/353 |
| 4,695,748 | 9/1987 | Kumamoto | 307/362 |
| 4,764,689 | 8/1988 | Thommen | 307/353 |
| 4,845,383 | 7/1989 | Iida | 307/353 |
| 4,978,872 | 12/1990 | Morse et al. | 307/352 |
| 5,180,930 | 1/1993 | Mayes | 307/355 |

OTHER PUBLICATIONS

Title page and pp. 296–299, 616–619, and 654–655 of VLSI Design Techniques For Analog And Digital Circuits, author: Randall L. Geiger et al, published by McGraw-Hill Publishing Company, New York, 1990.

Primary Examiner—Timothy P. Callahan
Assistant Examiner—My-Trang Nu Ton
Attorney, Agent, or Firm—Steven M. Rabin

[57] ABSTRACT

A sample-and-hold circuit, capable of charging and discharging its holding capacitor quickly regardless of a voltage of an analog input signal and an output impedance of an analog driving source, includes a pre-sampling capacitor and at least one CMOS inverter. Before the holding capacitor holds the sampled signal, the pre-sampling capacitor stores the signal level of the analog input signal, and then the CMOS inverter charges and discharges the one side of the holding capacitor according to the stored voltage in the pre-sampling capacitor. Since the one side of the holding capacitor is charged and discharged by the CMOS inverter thus controlled, the sample-and-hold circuit can operate with high speed and handle a wide range of the analog input signal.

20 Claims, 5 Drawing Sheets

SAMPLE-AND-HOLD CIRCUIT

CROSS-REFERENCE TO RELATED APPLICATION

This application claims priority benefits under 35 U.S.C §119 of Japanese application Serial No. 4-134,798, filed May 27th, 1992, the entire disclosure of which is incorporated herein by reference.

BACKGROUND OF THE INVENTION

1. Field of the Invention

This invention relates to a sample-and-hold circuit used for an input portion of an analog-to-digital converter (hereinafter called as "A/D converter").

2. Description of Related Art

A sample-and-hold circuit is constituted of a transmission gate, or an analog switch, for converting a continuous analog signal to a discrete signal, and a holding capacitor for storing an output of the transmission gate between samples. Such a sample-and-hold circuit has been often used at an analog input portion of a successive approximation type A/D converter.

When the sample-and-hold circuit is constituted only of the transmission gate and the holding capacitor and when an analog driving source has a high output impedance, the CR time constant of the circuit becomes large, and therefore, a longer time is needed to charge or discharge the holding capacitor.

In order to charge and discharge the holding capacitor quickly, a sample-and-hold circuit including an operational amplifier has been proposed and come into wide use. The operational amplifier of the sample-and-hold circuit is connected between an input terminal of the sample-and-hold circuit and the transmission gate, and is built as a voltage follower by connecting its output to its inverting input terminal. Since the input impedance of the operational amplifier is very high, the holding capacitor can be charged and discharged quickly even if the analog driving source has a high output impedance, for instance such as of several deca-kilo ohm or above.

Such an operational amplifier is typically constituted of a plurality of MOS transistors, and a pair of the MOS transistors among them forms the differential amplifier by commonly connecting their sources to a constant current source in the operational amplifier. In order to operate the operational amplifier formed of the MOS transistors, the pair of the MOS transistors must be in an active mode. However, generally speaking, an MOS transistor does not amplify when the voltage difference between its gate and its source is less than its threshold voltage. For example, where the differential amplifier of an operational amplifier is formed of pMOS transistors, the source voltage of the pMOS transistor is no more than a power supply voltage $V_{DD}$, for instance, 5 V. The threshold voltage Vth of the pMOS transistors is typically 1.5 V. Therefore, if an input voltage is in a range from 5 V ($=V_{DD}$) to 3.5 V ($=V_{DD}$ - Vth), the differential amplifier of the operational amplifier is not activated. This limits the analog input voltage of the sample-and-hold circuit including the operational amplifier.

SUMMARY OF THE INVENTION

It is an object of the invention to provide a sample-and-hold circuit capable of charging and discharging its holding capacitor quickly, regardless of an analog input signal and an impedance of an analog driving source.

The foregoing object is accomplished with a sample-and-hold circuit including gate means for sampling an analog input signal, a holding capacitor for holding a signal sampled by the gate means, a pre-sampling capacitor for storing a signal level of the analog input signal, and at least one CMOS inverter for charging and discharging the holding capacitor. Before the holding capacitor holds the sampled signal in each cycle, the pre-sampling capacitor stores the signal level of the analog input signal, and then, at least one of the CMOS inverters charges or discharges the holding capacitor according to the signal level stored, or pre-sampled by the pre-sampling capacitor. Since the signal level stored at the pre-sampling capacitor is not so different from the signal which is going to be held at the holding capacitor in a short period of time, the holding capacitor is charged or discharged by at least one of the CMOS inverters in advance. The CMOS inverter is capable of responding to the entire range of voltage levels from a power supply level to a ground level, and therefore, the sample-and-hold capacitor can operate regardless of the level of the analog input signal.

In accordance with a preferred embodiment, the CMOS inverter operates as a voltage follower, and therefore, outputs an output signal of a voltage equal to the signal level stored in the pre-sampling capacitor to the one side of the holding capacitor. The number of the CMOS inverters in the sample-and-hold circuit is an odd number, for instance, one, three, or above, for inverting a signal. Each of the CMOS inverter is formed with a loop connecting the input and output of the inverter and having a switch. The switch is closed for feeding one side of the pre-sampling capacitor when or before the pre-sampling capacitor stores the signal level of analog input signal. The capacity of the pre-sampling capacitor can be smaller than that of the holding capacitor to store the signal level quickly. According to an embodiment, the gate means includes a transmission gate directly connected between the input terminal and the one side of the holding capacitor to bypass the pre-sampling capacitor and the CMOS inverter, so that the holding capacitor can hold the signal accurately.

BRIEF DESCRIPTION OF THE DRAWINGS

The above and other objects and features of the invention are apparent to those skilled in the art from the following preferred embodiments thereof when considered in conjunction with the accompanied drawings, in which.

DETAILED DESCRIPTION OF THE PREFERRED EMBODIMENTS

Figure 1:
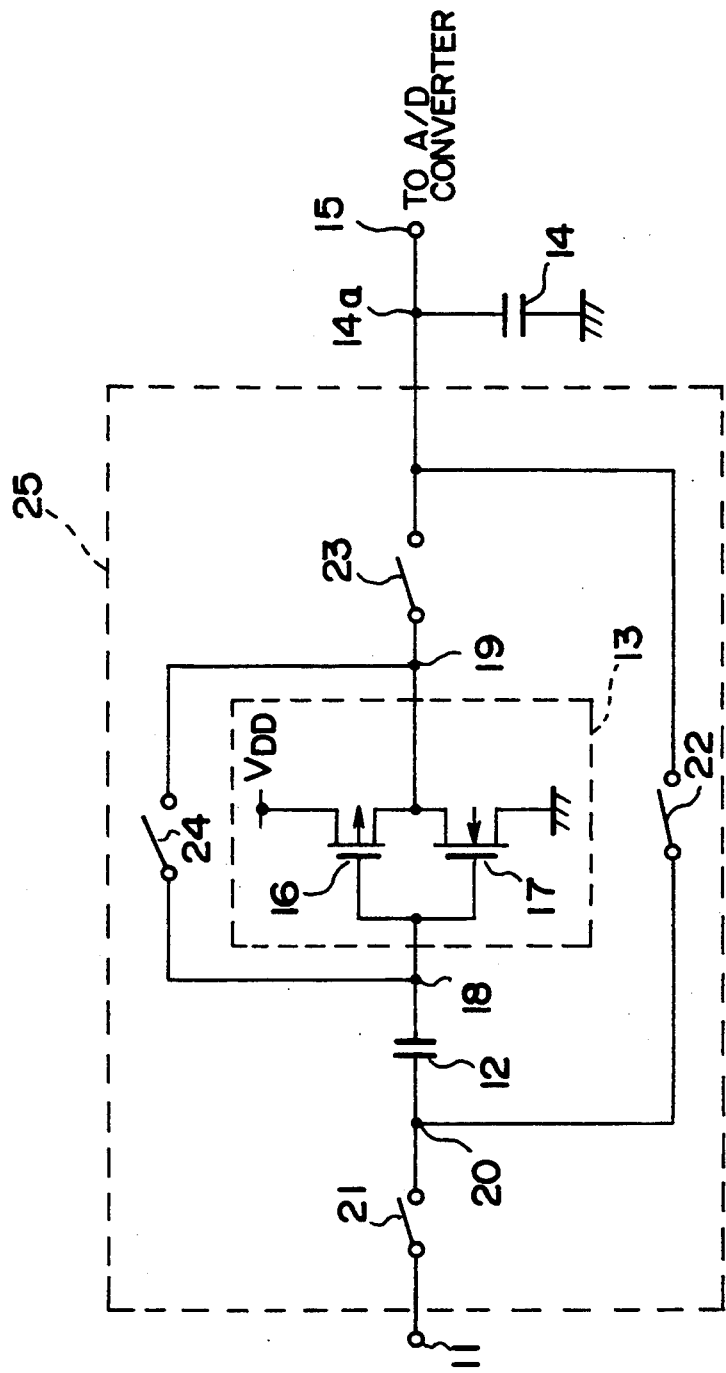
FIG. 1 is a diagram illustrating a circuitry of a sample-and-hold circuit according to a preferred embodiment of the invention.

Referring to the drawings in detail, in particular, to FIG. 1, a sample-and-hold circuit according to a preferred embodiment of the invention is shown.

The sample-and-hold circuit includes an input terminal 11 for receiving an analog input signal, a pre-sampling capacitor 12 for storing the analog input signal before holding, a CMOS inverter 13, a holding capacitor 14 for holding a signal arrived at its one side 14a, and an output terminal 15 connected to an A/D converter not shown. The CMOS inverter 13 is constituted of a pMOS transistor 16 and an nMOS transistor 17 as well known to those skilled in the art. The source of the pMOS transistor 16 is supplied with a power supply voltage $V_{DD}$, and the source of the nMOS transistor 17 is supplied with a ground voltage. The gates of the pMOS transistor 16 and the nMOS transistor 17 are integrated into an input 18 of the CMOS inverter 13. The commonly connected drains of the pMOS transistor 16 and the nMOS transistor 17 are used as an output 19 of the CMOS inverter 13. The sample-and-hold circuit further includes first to fourth switches 21 to 24 for electrically connecting and disconnecting respective circuit elements. The first switch 21 is provided between the input terminal 11 and a node 20. The first switch 21 transmits the analog input signal to the pre-sampling capacitor 12 during a pre-sampling mode and to the holding capacitor 14 through the second switch 22 during a direct sampling mode, as described below. The pre-sampling capacitor 12 is connected between the node 20 and the input 18 of the CMOS inverter 13. The pre-sampling capacitor 12 stores the signal level of the analog input signal received by the input terminal 11 during the pre-sampling mode. The second switch 22 is connected between the node 20 and the one side 14a of the holding capacitor 14. The second switch 22 serves as gate means as well as the first switch 21, and moreover, the loop formed with the second switch 22 serves as a feedback loop for a voltage follower in cooperation with the third switch 23. The third switch 23 is connected between the output 19 of the CMOS inverter 13 and the one side 14a of the holding capacitor 14. The third switch 23 is closed only when the CMOS inverter 13 serves as a voltage follower, thereby charging and discharging the holding capacitor 14 quickly. The fourth switch 24 is connected between the output 19 and the input 18 of the CMOS inverter 13. When the fourth switch 24 is closed during the pre-sampling mode, the voltage levels of input 18 and the output 19 are equalized at $\frac{1}{2} V_{DD}$. The equalized voltage of the input 18 is used as a reference voltage for the pre-sampling capacitor 12. The one side 14a of the holding capacitor 14 is connected to the second and third switches 22, 23 and the output terminal 15. The other end of the holding capacitor 14 is connected to the ground voltage. The holding capacitor 14 is charged and discharged during voltage follower mode, and holds the sampled signal during holding mode to output to the output terminal 15. The capacitance of the pre-sampling capacitor 12 is designed to be smaller than the capacitance of the holding capacitor 14. This is because the pre-sampling capacitor 12 quickly operates for a precedent approximation of the analog input signal for the CMOS inverter 13. For example, the capacitance of the pre-sampling capacitor 12 is set at 1 or 2 pF, while the capacitance of the holding capacitor 14 is set at 256 pF. The circuit elements, except the input and output terminal 11, 15 and the holding capacitor 14, form a sampling circuit 25 as shown in FIG. 1.

Figure 2:
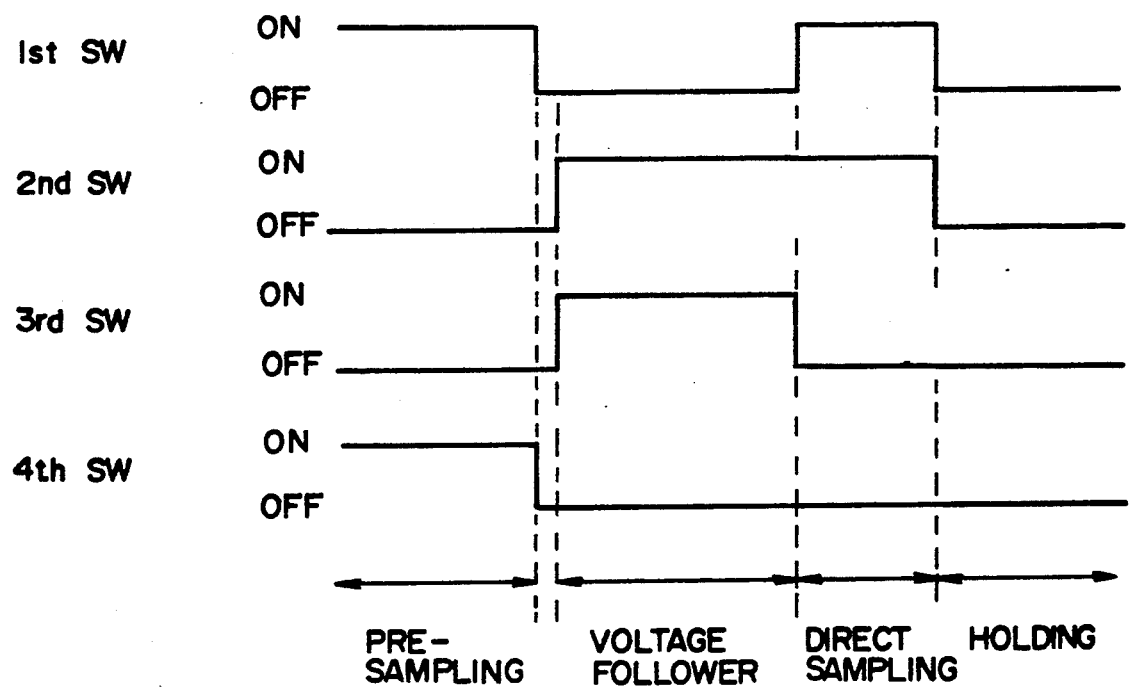
FIG. 2 is a time chart showing ON (closed) and OFF (open) states of switches shown in FIG. 1.

In operation, each cycle of the sample-and-hold circuit consists of the pre-sampling mode, the voltage follower mode, the direct sampling mode, and the holding mode, which are repeated in this order. FIG. 2 is a time chart showing ON (closed) and OFF (open) states of each switch in association with each mode. In FIG. 2, the high level represents ON state of each switch, and the low level represents OFF state of each switch.

The pre-sampling mode is for storing the analog input signal $V_A$ on the pre-sampling capacitor 12. This pre-sampling mode proceeds to the direct sampling mode, and the pre-sampling capacitor 12 is charged and discharged separately in association with the holding capacitor 14. When the first and fourth switches 21, 24 are turned on and the second and third switches 22, 23 are turned off, the analog input signal applied to the input terminal 11 is transmitted to the node 20 through the first switch 21. Since the fourth switch 24 short-circuits a loop between the input 18 and the output 19 of the CMOS inverter 13, the level of the input 18 and the output 19 become a threshold voltage Vth of the CMOS inverter 13, for example, 2.5 V, or $\frac{1}{2} V_{DD}$. Accordingly, the pre-sampling capacitor 12 charges to a voltage difference between the analog input signal $V_A$ and the threshold voltage Vth and stores it.

After the pre-sampling mode, the first and fourth switches 21, 24 are turned off, thereby shutting down an escape route of pre-sampled electric charges from the pre-sampling capacitor 12, and thereby allowing the pre-sampling capacitor 12 to hold the voltage difference ($V_A$ - Vth). Then, the second and third switches 22, 23 are turned on, so that the voltage follower mode starts. In this voltage follower mode, the CMOS inverter 13 is directly connected to the one side 14a of the holding capacitor 14 through the third switch 23, and the output 19 of the CMOS inverter 13 is fed back to the input 18 through the second switch 22 and the pre-sampling capacitor 12. At the beginning of the voltage follower mode, ordinarily, a held signal of a previous cycle still remains at the one side 14a of the holding capacitor 14. For example, if the level of the one side 14a is near to a ground level, the level of the node 20 is pulled down toward the ground level through the second switch 22, and therefore, the level of the input 18 also drops through the pre-sampling capacitor 12 at the same time. Since the level of the input 18 shifts from the threshold voltage Vth to another lower level, the CMOS inverter 13 begins to drive, and therefore, the voltage level on the output 19 of the CMOS inverter 13 changes toward the power supply voltage $V_{DD}$. To the contrary, if the level of the one side 14a is near to the power supply voltage $V_{DD}$, the level of the input 18 is pulled up through the second switch 22 and the pre-sampling capacitor 12, and then, the voltage level on the output 19 changes toward the ground level.

According to the level of the output 19, the holding capacitor 14 is charged or discharged quickly. For example, in the case that the CMOS inverter 13 outputs the level of the power supply voltage $V_{DD}$, the one side 14a is quickly charged toward the power supply voltage $V_{DD}$ even if the holding capacitor 14 has a relatively large capacity. This is because the output impedance of the CMOS inverter 13 is very low. As the level of the one side 14a increases, the level of the node 20 increases, and the level of the input 18 increases at the same time. When the level of the input 18 exceeds the threshold voltage Vth of the CMOS inverter 13, the CMOS inverter 13 turns over and begins to output the level of the ground voltage, thereby discharging the one side 14a. The CMOS inverter 13 repeats such charging and discharging operations alternatively, so that the level of the one side 14a of the holding capacitor 14 is converged around the analog input signal $V_A$ stored, at the end of the pre-sampling mode, in the pre-sampling capacitor 12. To the contrary, if the CMOS inverter 13 outputs the level of the ground voltage, the one side 14a of the holding capacitor 14 is quickly discharged. Similarly to the operation described above, when the level of the input 18 drops below the threshold voltage Vth, the CMOS inverter 13 turns over and begins to output the power supply voltage $V_{DD}$, thereby charging the one side 14a. The CMOS inverter 13 repeats such charging and discharging operations alternatively, so that the level of the one side 14a is converges to around the analog input signal $V_A$ in the same manner as described above. Consequently, the sample-and-hold circuit can charge and discharge the holding capacitor 14 sufficiently, since the CMOS inverter 13 is always in an active state even if the analog input signal $V_A$ is in a wide range from the power supply voltage $V_{DD}$ to the ground voltage.

In the direct sampling mode, the first switch 21 is turned on and the third switch 23 is turned off, so that the CMOS inverter 13 is disconnected from the one side 14a of the holding capacitor 14, and the one side 14a directly receives the analog input signal as a sampled signal through the first and second switches 21, 22 as gate means. This mode is set since it is difficult to sample the signal with minor errors during the voltage follower mode. Although, strictly speaking, the analog input signal $V_A$ supplied to the one side 14a in the direct sampling mode is different from the analog input signal previously supplied thereto, there is no influence with the A/D converting operation performed at a next stage of this sample-and-hold circuit, since the operation of this sample-and-hold circuit is performed with very high speed. The holding capacitor 14 holds the signal at a time of the end of the direct sampling mode.

In the holding mode, the first and second switch 21, 22 are turned off so that the all switches 21 to 24 are turned off. During the holding mode, the holding capacitor 14 supplies a constant voltage as an output signal of the sample-and-hold circuit to the A/D converter connected as the next stage for converting it to a digital signal.

Figure 3:
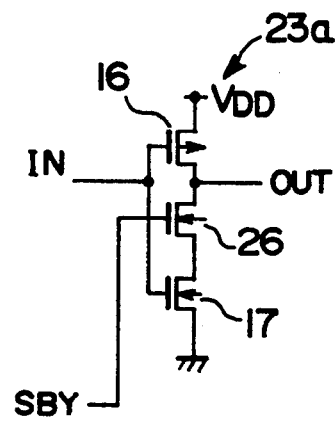
FIG. 3 is a diagram illustrating another example of a CMOS inverter of the sample-and-hold circuit shown in FIG. 1.

In FIG. 3, another variation of a CMOS inverter for the sample-and-hold circuit is illustrated. This CMOS inverter 23a has an nMOS transistor 26 connected between the pMOS transistor 16 and the nMOS transistor 17. The gate of the nMOS transistor 26 receives a standby signal SBY to reduce power consumption in the sample-and-hold circuit. The standby signal STY make the nMOS transistor 26 conducting only during the pre-sampling mode and the voltage follower mode.

Figure 4:
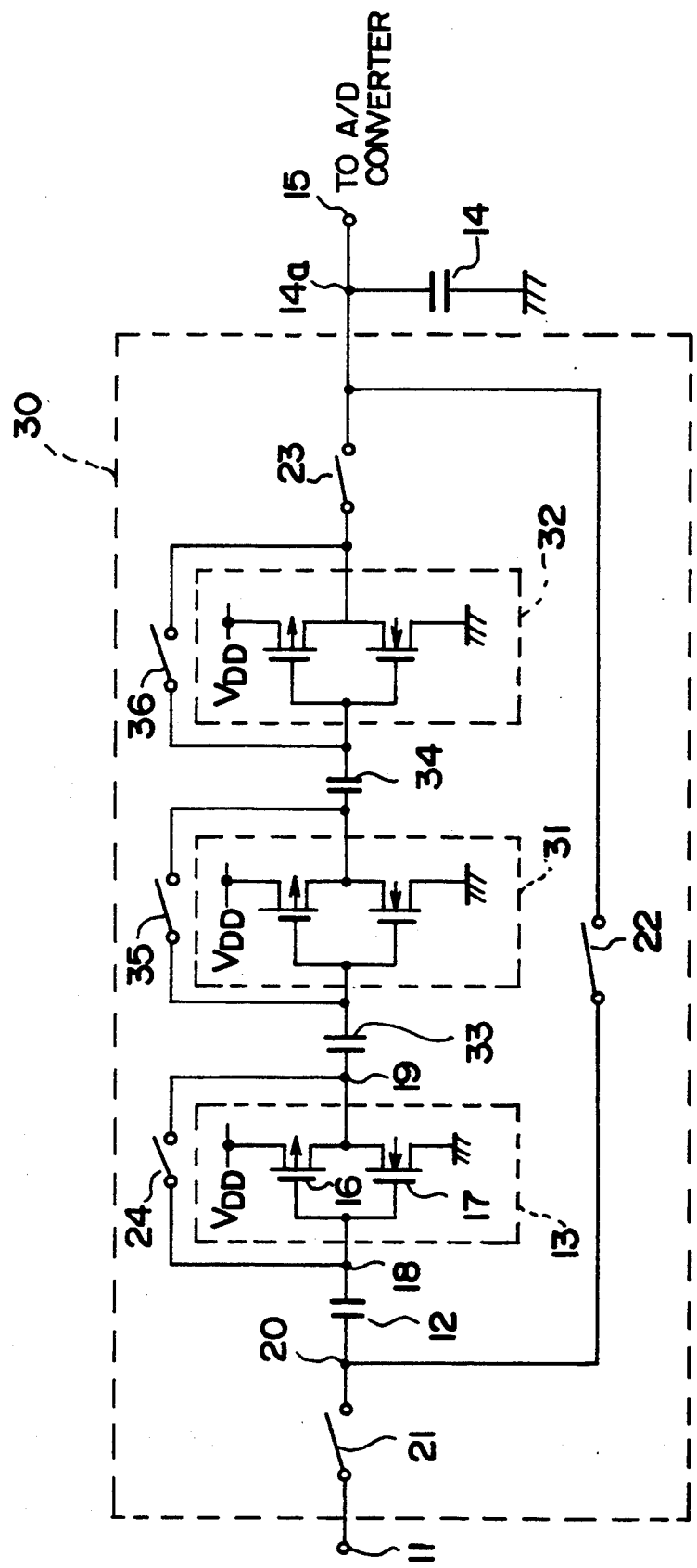
FIG. 4 is a diagram illustrating a circuitry of a sample-and-hold circuit according to another preferred embodiment of the invention.

Referring to FIG. 4, a sample-and-hold circuit of another preferred embodiment, capable of charging and discharging the holding capacitor more quickly, is shown. The sample-and-hold circuit includes two CMOS inverters 31, 32 and two capacitors 33, 34 for coupling in addition to the structure of the sample-and-hold circuit shown in FIG. 1. The input of the CMOS inverter 31 is connected to the output 19 of the CMOS inverter 13 through the capacitor 33, and the input of the CMOS inverter 32 is connected to the output of the CMOS inverter 31 through the capacitor 34. The output of the CMOS inverter 32 is connected to the third switch 23. These CMOS inverters 31, 32 are formed with the fourth switches 35, 36, respectively, for electrically connecting and disconnecting the input and the output thereof. The circuit elements, except the input and output terminals 11, 15 and the holding capacitor 14, form a sampling circuit 30 as shown in FIG. 4.

The operation of the sample-and-hold circuit shown in FIG. 4 is basically the same as that shown in FIG. 1. The fourth switches 35, 36 are turned on and off in synchrony with the fourth switch 24. The CMOS inverter 13 drives the CMOS inverter 31, which drives the CMOS inverter 32. In this series of the CMOS inverters 13, 31, and 32, the inputted signal is amplified more largely as the signal proceeds to the next CMOS inverter, thereby resulting in quicker charges and discharges of the holding capacitor 14. The number of the CMOS inverters is set to an odd number, so that the final CMOS inverter can output the signal as well as the CMOS inverter of the sample-and-hold circuit in FIGS. 1.

Figure 5:
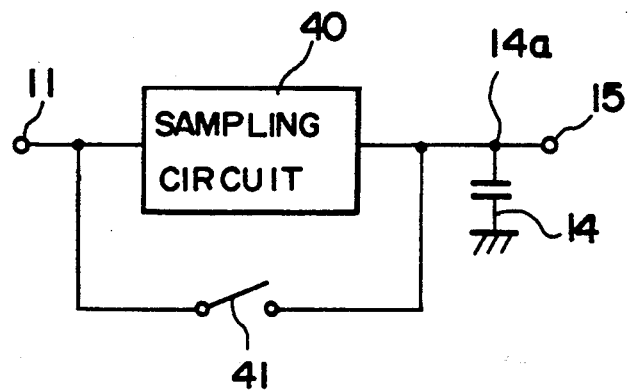
FIG. 5 is a diagram illustrating a circuitry of a sample-and-hold circuit according to yet another preferred embodiment of the invention.
Figure 6:
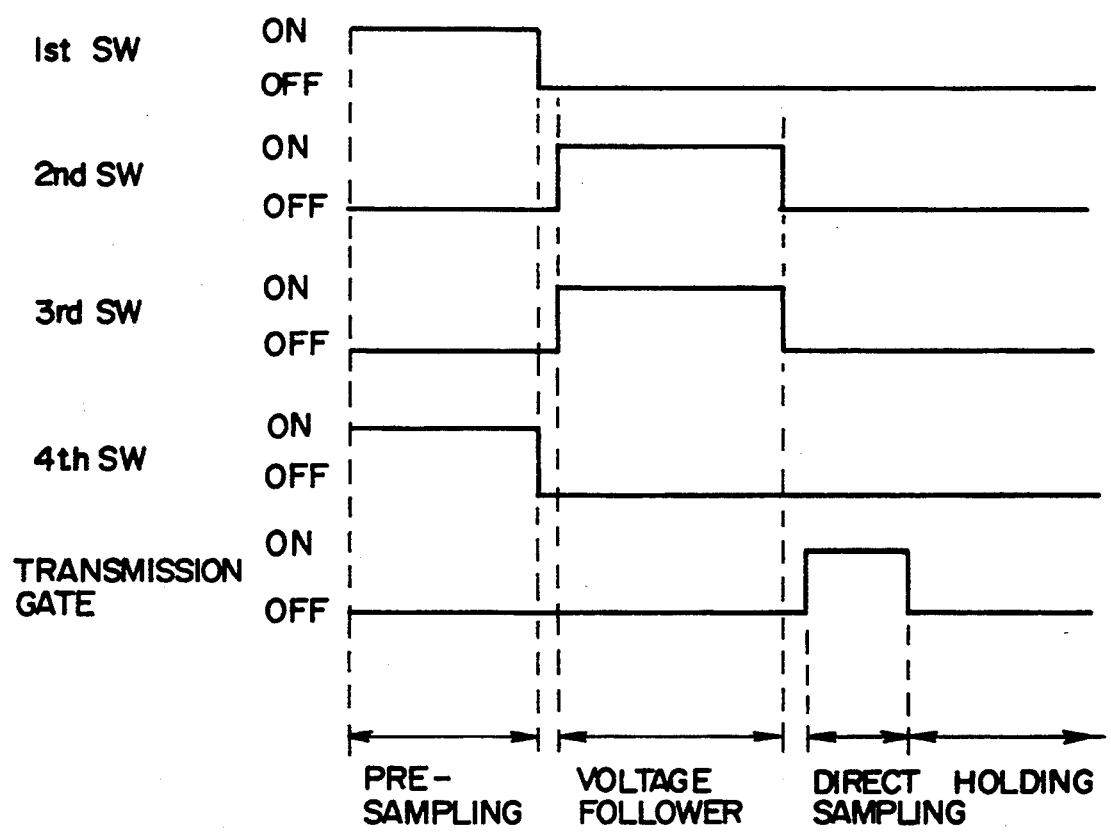
FIG. 6 is a time chart showing ON and OFF states of switches in the sample-and-hold circuit shown in FIG. 5.

Referring to FIGS. 5, 6, a sample-and-hold circuit for sampling the analog input signal without an error according to yet another preferred embodiment of the invention, is shown.

The sampling circuit 40 is constructed as well as either the sampling circuit 25 in FIG. 1 or the sampling circuit 30 in FIG. 4. A transmission gate 41 is provided between the input terminal 11 and the one side 14a of the holding capacitor 14.

In operation, the differences between the sample-and-hold circuits in FIGS. 1 and 5 are that the first switch 21 and the second switch 22 are turned off during the direct sampling mode, and that the transmission gate 41 is closed only during the direct sampling mode, as shown in FIG. 6. After the voltage follower mode, all the switches are turned off. Then, only the transmission gate 41 is turned on to sample the signal. According to this sample-and-hold circuit, since the pre-sampling capacitor 12 is not connected to the holding capacitor 14 during the direct sampling mode, the signal is sampled without any influence from the capacitance of the pre-sampling capacitor 12.

As described above, the sample-and-hold circuit can sample the analog input signal at a high speed even if the analog driving source has a high output impedance, and can sample the analog input signal in a wide range between the ground voltage and the power supply voltage. Accordingly, when applied to a successive approximation type A/D converter, in particular, to an A/D converter of a type having a large capacitance, such as of a type having a ladder formed of capacitors, the sample-and-hold circuit contributes to the A/D converter with great efficiency.

It is understood that although the present invention has been described in detail with respect to preferred embodiments thereof, various other embodiments and variations are possible to those skilled in the art which fall within the scope and spirit of the invention, and such other embodiments and variations are intended to be covered by the following claims.

What is claimed is:

1. A sample-and-hold circuit comprising:
    an input terminal for receiving an input signal having a predetermined voltage level;

an output terminal for outputting a signal having the predetermined voltage level;

first, second and third nodes;

a first switch coupled between said input terminal and said first node;

a pre-sampling capacitor coupled between said first node and said second node;

a CMOS inverter coupled between said second node and said third node and having first and second voltage supply terminals, for outputting to said third node a voltage level ranging from a first voltage level applied to the first voltage supply terminal to a second voltage level applied to the second voltage supply terminal;

a second switch coupled between said first node and said output terminal;

a third switch coupled between said third node and, said output terminal; and a fourth switch coupled between said second node and said third node;

wherein among said first to fourth switches, only said first switch and said fourth switch are closed during a first period, only said second switch and said third switch are closed during a second period following the first period, and only said first switch and said second switch are closed during a third period following the second period.

2. A sample-and-hold circuit as set forth in claim 1, further comprising:

a holding capacitor coupled to said output terminal.

3. A sample-and-hold circuit as set forth in claim 2, wherein said holding capacitor has a capacitance more than a capacitance of said pre-sampling capacitor.

4. A sample-and-hold circuit, comprising:

an input terminal for receiving an input signal having a predetermined voltage level;

an output terminal for outputting a signal having the predetermined voltage level;

first, second and third nodes:

a first switch coupled between said input terminal and said first node;

a pre-sampling capacitor coupled between said first node and said second node;

a CMOS inverter coupled between said second node and said third node and having first and second voltage supply terminals, for outputting to said third node a voltage level ranging from a first voltage level applied to the first voltage supply terminal to a second voltage level applied to the second voltage supply terminal;

a second switch coupled between said first node and said output terminal;

a third switch coupled between said third node and said output terminal;

a fourth switch coupled between said second node and said third node; and, a fifth switch coupled between said circuit input terminal and said circuit output terminal.

5. A sample-and-hold circuit as set forth in claim 4, wherein among said first to fifth switches, only said first switch and said fourth switch are closed during a first period, only said second switch and said third switch are closed during a second period following the first period, and only said fifth switch is closed during a third period following the second period.

6. A sample-and-hold circuit, comprising:

a circuit input terminal for receiving an input signal having a predetermined voltage level;

a circuit output terminal for outputting an output signal having the predetermined voltage level;

first, second and third nodes;

a first switch coupled between said circuit input terminal and said first node;

a second switch coupled between said first node and said circuit output terminal;

a third switch coupled between said third node and said circuit output terminal;

a pre-sampling capacitor coupled between said first node and said second node;

an odd number, greater than one, of successively series connected charging and discharging circuits, coupled between said second node and said third node, each charging and discharging circuit including a CMOS inverter, the CMOS inverter having a first voltage supply terminal, a second voltage supply terminal, an inverter input terminal and an inverter output terminal, for outputting to the inverter output terminal, in response to voltage level applied to the inverter input terminal, a voltage level ranging from a first voltage level applied to the first voltage supply terminal to a second voltage level applied to the second voltage supply terminal, and a fourth switch coupled across the CMOS inverter between the inverter input terminal and the inverter output terminal; and coupling capacitors coupling the respective CMOS inverters of successive charging and discharging circuits at the inverter output terminals and inverter input terminals thereof;

wherein among the first to fourth switches only said first switch and the fourth switch of each charging and discharging circuit, are closed during the first period.

only said second and third switches are closed during a second period following the first period, and only said first and second switches are closed during a third period following the second period.

7. A sample-and-hold circuit as set forth in claim 6, further comprising a holding capacitor coupled to said output terminal.

8. A sample-and-hold circuit as set forth in claim 7, wherein said holding capacitor has a capacitance greater than a capacitance of said pre-sampling capacitor.

9. A sample-and-hold circuit, comprising;

a circuit input terminal for receiving an input signal having a predetermined voltage level;

a circuit output terminal for outputting an output signal having the predetermined voltage level;

first, second and third nodes:

a first switch coupled between said circuit input terminal and said first node;

a second switch coupled between said first node and said circuit output terminal;

a third switch coupled between said third node and said circuit output terminal;

a pre-sampling capacitor coupled between said first node and said second node;

an odd number, greater than one, of successively series connected charging and discharging circuits, coupled between said second node and said third node, each charging and discharging circuit including a CMOS inverter, the CMOS inverter having a first voltage supply terminal, a second voltage supply terminal, an inverter input terminal and an inverter output terminal, for outputting to the inverter output terminal, in response to voltage level applied to the inverter input terminal, a voltage level ranging from a first voltage level applied to the first voltage supply terminal to a second voltage level applied to the second voltage supply terminal, and a fourth switch coupled across the CMOS inverter between the inverter input terminal and the inverter output terminal;

coupling capacitors coupling the respective CMOS inverters of successive charging and discharging circuits at the inverter output terminals and inverter input terminals thereof; and a fifth switch coupled between said circuit input terminal and said circuit output terminal.

10. A sample-and-hold circuit as set forth in claim 9, wherein among the first to fifth switches:

only the first switch, and the fourth switch of each charging and discharging circuit, are closed during a first period;

only said second and third switches are closed during a second period following the first period; and only said fifth switch is closed during a third period following the second period.

11. A sample-and-hold circuit, comprising:

an input terminal for receiving an input signal having a predetermined voltage level;

an output terminal for outputting an output signal having the predetermined voltage level;

first, second and third nodes;

a first switch coupled between said input terminal and said first node;

a pre-sampling capacitor coupled between said first node and said second node;

a MOS inverter, coupled between said second node and said third node, and having first and second voltage supply terminals, for outputting to said third node, in response to voltage level applied to said second node, a voltage level ranging from a first voltage level applied to the first voltage supply terminal to a second voltage level applied to the second voltage supply terminal;

a second switch coupled between said first node and said output terminal;

a third switch coupled between said third node and said output terminal; and a fourth switch coupled between said second node and said third node;

wherein among the first to fourth switches
only said first switch and said fourth switch are closed during the first period, only said second and third switches are closed during a second period following the first period, and only said first and second switches are closed during a third period following the second period.

12. A sample-and-hold circuit as set forth in claim 11, further comprising a holding capacitor coupled to said output terminal.

13. A sample-and-hold circuit as set forth in claim 12, wherein said holding capacitor has a capacitance greater than a capacitance of said pre-sampling capacitor.

14. A sample-and-hold circuit, comprising:

an input terminal for receiving an input signal having a predetermined voltage level;

an output terminal for outputting an output signal having the predetermined voltage level;

first, second and third nodes;

a first switch coupled between said input terminal and said first node;

a pre-sampling capacitor coupled between said first node and said second node;

a MOS inverter, Coupled between said second node and said third node, and having first and second voltage supply terminals, for outputting to said third node, in response to voltage level applied to said second node, a voltage level ranging from a first voltage level applied to the first voltage supply terminal to a second voltage level applied to the second voltage supply terminal;

a second switch coupled between said first node and said output terminal;

a third switch coupled between said third node and said output terminal; and a fourth switch coupled between said second node and said third node; and a fifth switch coupled between said input terminal and said output terminal.

15. A sample-and-hold circuit as set forth in claim 14, wherein among the first to fifth switches:

only said first switch and said fourth switch are closed during a first period;

only said second and third switches are closed during a second period following the first period; and only said fifth switch is closed during a third period following the second period.

16. A sample-and-hold circuit, comprising:

a circuit input terminal for receiving an input signal having a predetermined voltage level;

a circuit output terminal for outputting an output signal having the predetermined voltage level;

first, second and third nodes;

a first switch coupled between said circuit input terminal and said first node;

a second switch coupled between said first node and said circuit output terminal;

a third switch coupled between said third node and said circuit output terminal;

a pre-sampling capacitor coupled between said first node and said second node;

an odd number, greater than one, of successively series connected charging and discharging circuits, coupled between said second node and said third node, each charging and discharging circuit including a MOS inverter, the MOS inverter having a first voltage supply terminal, a second voltage supply terminal, an inverter input terminal and an inverter output terminal, for outputting to the inverter output terminal, in response to voltage level applied to the inverter input terminal, a voltage level ranging from a first voltage level applied to the first voltage supply terminal to a second voltage level applied to the second voltage supply terminal, and a fourth switch coupled across the MOS inverter between the inverter input terminal and the inverter output terminal; and coupling capacitors coupling the respective MOS inverters of successive charging and discharging circuits at the inverter output terminals and inverter input terminals thereof;

wherein among the first to fourth switches only the first switch and the fourth switch of each charging and discharging circuit are closed during the first period, only said second and third switches are closed during a second period following the first period, and only said first and second switches are closed during a third period following the second period.

17. A sample-and-hold circuit as set forth in claim 16, further comprising a holding capacitor coupled to said output terminal.

18. A sample-and-hold circuit as set forth in claim 17, wherein said holding capacitor has a capacitance greater than a capacitance of said pre-sampling capacitor.

19. A sample-and-hold circuit, comprising:
a circuit input terminal for receiving an input signal having a predetermined voltage level;
a circuit output terminal for outputting an output signal having the predetermined voltage level;
first, second and third nodes:
a first switch coupled between said circuit input terminal and said first node;
a second switch coupled between said first node and said circuit output terminal;
a third switch coupled between said third node and said circuit output terminal;
a pre-sampling capacitor coupled between said first node and said second node;
an odd number, greater than one, of successively series connected charging and discharging circuits, coupled between said second node and said third node, each charging and discharging circuit including
a MOS inverter, the MOS inverter having a first voltage supply terminal, a second voltage supply terminal, an inverter input terminal and an inverter output terminal, for outputting to the inverter output terminal, in response to voltage level applied to the inverter input terminal, a voltage level ranging from a first voltage level applied to the first voltage supply terminal to a second voltage level applied to the second voltage supply terminal, and
a fourth switch coupled across the MOS inverter between the inverter input terminal and the inverter output terminal;
coupling capacitors coupling the respective MOS inverters of successive charging and discharging circuits at the inverter output terminals and inverter input terminals thereof; and
a fifth switch coupled between said circuit input terminal and said circuit output terminal.

20. A sample-and-hold circuit as set forth in claim 19, wherein among the first to fifth switches:
only said first switch, and the fourth switch of each charging and discharging circuit, are closed during a first period;
only said second and third switches are closed during a second period following the first period; and
only said fifth switch is closed during a third period following the second period.

* * * * *